United States Patent
Lovicott et al.

(10) Patent No.: US 9,945,576 B2
(45) Date of Patent: Apr. 17, 2018

(54) SYSTEM AND METHOD FOR DETECTING THE PRESENCE OF ALTERNATE COOLING SYSTEMS

(71) Applicant: Dell Products, LP, Round Rock, TX (US)

(72) Inventors: Dominick A. Lovicott, Round Rock, TX (US); William K. Coxe, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 14/509,592

(22) Filed: Oct. 8, 2014

(65) Prior Publication Data
US 2016/0102880 A1  Apr. 14, 2016

(51) Int. Cl.
| | |
|---|---|
| G06F 3/00 | (2006.01) |
| H05K 7/20 | (2006.01) |
| G08B 17/00 | (2006.01) |
| G06F 1/00 | (2006.01) |
| G06F 11/30 | (2006.01) |
| F24F 11/00 | (2018.01) |

(52) U.S. Cl.
CPC ........ *F24F 11/008* (2013.01); *H05K 7/20727* (2013.01); *H05K 7/20836* (2013.01)

(58) Field of Classification Search
CPC .... G05D 23/00; G05D 23/19; G05D 23/1917; F24F 11/008; G06F 1/00; G06F 1/3206; G06F 3/0484; G06F 11/3058
USPC ........... 710/8, 14–15, 31; 361/699; 340/584; 713/340
See application file for complete search history.

(56) References Cited

U.S. PATENT DOCUMENTS

| | | | | |
|---|---|---|---|---|
| 6,157,897 | A * | 12/2000 | Yoshikawa | H05K 7/20209 361/164 |
| 7,064,511 | B2 | 6/2006 | Marando et al. | |
| 7,139,169 | B2 | 11/2006 | Alperin et al. | |
| 8,350,711 | B2 * | 1/2013 | Berke | G08B 21/02 340/584 |
| 8,595,515 | B1 * | 11/2013 | Weber | G06F 1/3206 713/300 |
| 2001/0004830 | A1 * | 6/2001 | Wakana | F02C 6/14 60/39.182 |
| 2004/0001310 | A1 * | 1/2004 | Chu | G06F 1/203 361/679.27 |
| 2007/0273012 | A1 * | 11/2007 | Ikuta | H01L 21/76838 257/675 |
| 2008/0002364 | A1 * | 1/2008 | Campbell | H05K 7/2079 361/699 |
| 2010/0030394 | A1 * | 2/2010 | Lewis | G05D 23/19 700/300 |

(Continued)

OTHER PUBLICATIONS

U.S. Appl. No. 14/445,419, filed Jul. 29, 2014.

*Primary Examiner* — Farley Abad
*Assistant Examiner* — Henry Yu
(74) *Attorney, Agent, or Firm* — Larson Newman, LLP

(57) ABSTRACT

An information handling system includes a plurality of components, and a controller. The controller determines a separate thermal resistance for each of the components, categorizes each component into one of a plurality of cooling domains based on the thermal resistance of the component and an amount of air flow around the component, and adjusts cooling controls for each of the components based on the respective cooling domain of the component.

20 Claims, 4 Drawing Sheets

(56) References Cited

U.S. PATENT DOCUMENTS

| | | | |
|---|---|---|---|
| 2010/0085196 A1* | 4/2010 | Stiver | G06F 1/206 340/584 |
| 2012/0221287 A1* | 8/2012 | Ioannidis | G01K 1/12 702/132 |
| 2012/0272100 A1* | 10/2012 | Chase | G06F 11/24 714/34 |
| 2013/0073096 A1* | 3/2013 | Brey | G05D 23/19 700/282 |
| 2013/0128918 A1* | 5/2013 | Campbell | H05K 7/20836 374/57 |
| 2014/0201558 A1* | 7/2014 | Darrington | G06F 11/3058 713/340 |
| 2014/0290916 A1 | 10/2014 | Arik et al. | |
| 2014/0291832 A1 | 10/2014 | Schwarz | |

* cited by examiner

SYSTEM AND METHOD FOR DETECTING THE PRESENCE OF ALTERNATE COOLING SYSTEMS

FIELD OF THE DISCLOSURE

The present disclosure generally relates to system and method for detecting the presence of alternate cooling systems.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

Information handling systems, such as servers, can have multiple cooling methods. For example, air or liquid may be circulated through a server, or the entire server may be immersed in a liquid for cooling.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
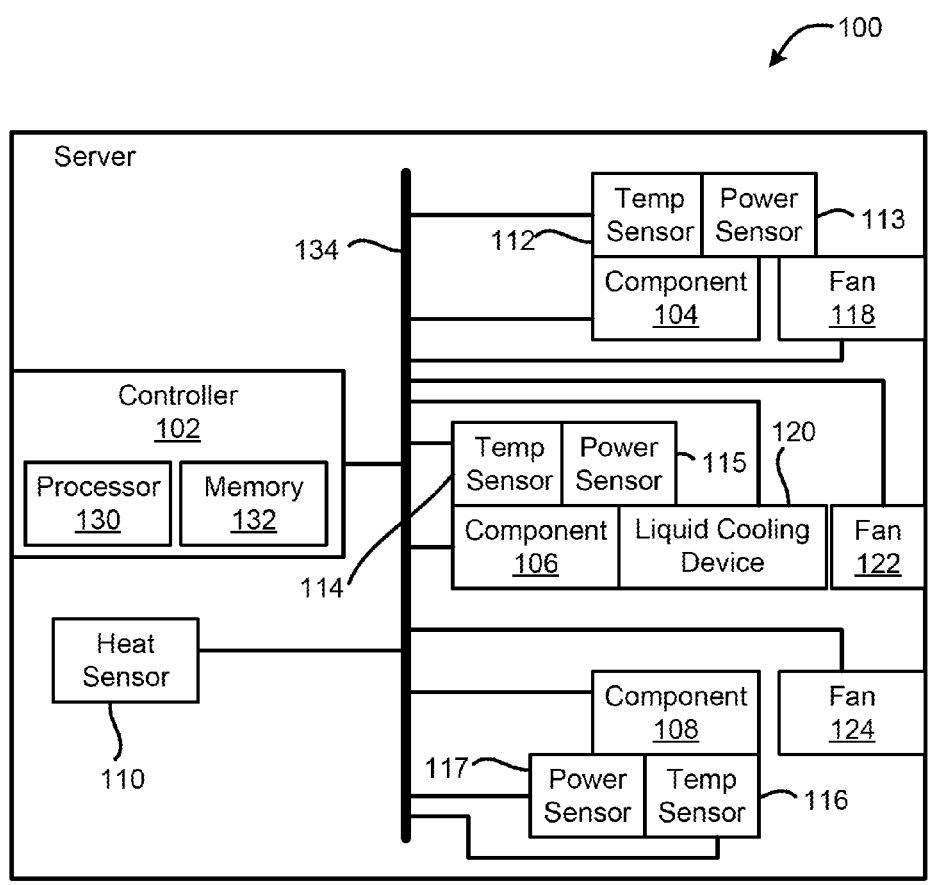
FIG. 1 is a block diagram of an information handling system.

FIG. 1 shows an information handling system such as a server 100. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The server 100 includes a controller 102, components 104, 106, and 108, temperature sensors 110, 112, 114, and 116, power sensors 113, 115, and 117, and cooling devices 118, 120, 122, and 124. The controller 102 is in communication with each of the components 104-108. The controller 102 is also in communication with each of the temperature sensors 110-116, and can receive temperature values from the temperature sensors. The controller 102 is in communication with each of the power sensors 113, 115, and 117, and can receive power readings of the components from the power sensors. The controller 102 is in communication with each of the cooling devices 118-124, and can set cooling controls for the cooling devices.

In an embodiment the controller 102 can be any type of controller, such as an integrated Dell Remote Access Controller (iDRAC) or another similar systems management engine. The controller 122 can have a processor 130, a memory 132, a battery, a network connection, and access to a server chassis bus 134. The controller 122 can provide different functions for the server 100, such as power management, cooling device control, virtual media access, and remote console capabilities. In an embodiment, the components 104-108 can be any combination of memory devices, processors, or the like.

During operation, the controller 102 can receive different values representing temperatures within the server 100 from the temperature sensors 110-116. The controller 102 can associate each of the each of the temperature values with a corresponding location within the server 100 based on the temperature sensor 110, 112, 114, or 116 that provided the temperature value. For example, the controller 102 can identify that temperature values received from temperature sensor 110 are ambient temperatures within the server 100. In an embodiment, the temperature sensor 110 can be positioned away from the components 104-108, such that the temperature detected by the temperature sensor is for an air inlet, air intake, or inlet ambient temperate for the server 100 without being overly influenced by any particular component.

The controller 102 can also distinguish between the other temperature sensors 112, 114, and 116, and can associate each temperature sensor with a particular component. For example, the controller 102 can identify that any temperature values received from temperature sensor 112 are associated with component 104. Similarly, the controller 102 can identify that any temperature values received from temperature sensor 114 are associated with component 106, and that any temperature values received from temperature sensor 116 are associated with component 108.

The controller 102 can receive power readings, such as how many Watts, Volts, or Amperes a particular component, such as components 104, 106, or 108, is using at any given point in time from its corresponding power sensor. The controller 102 can then utilize the temperature values received from each of the temperature sensors 110-116 and the power readings from power sensors 113, 115, and 17 to calculate a thermal resistance for each component. In an embodiment, the thermal resistance for a component is calculated by a temperature value difference between the temperature of the component and the ambient temperate, in Celsius, divided by the power reading, in Watts, as shown in equation 1 below:

$$\text{Thermal } Resistance_{Component}(R_T) = \frac{(Temperature_{Component}(C) - Temperature_{Ambient}(C))}{Power_{Component}(W)}$$

The controller 102 can then store the thermal resistance for each component in memory 132 of the controller. The controller 102 can receive a fan speed or air flow of each of the fans 118, 122, and 124, and can have previously associated each of the fans with a corresponding component 104, 106, or 108. The controller 102 can then compare the calculated thermal resistance versus air flow for a particular component with stored threshold values of thermal resistance versus air flow for different cooling domains of the information handling system 100. In an embodiment, the threshold values can be stored in a firmware table within memory 132. In another embodiment, the firmware table can be located within a memory located separate from the controller 102 or the like. The controller 102 determines a cooling domain for each of the components 104, 106, and 108, and the determined cooling domain can then be stored within memory 132 of the controller. For clarity, the cooling domains and mapping of the components to different cooling domains are graphically shown in FIG. 2-4.

Figure 2:
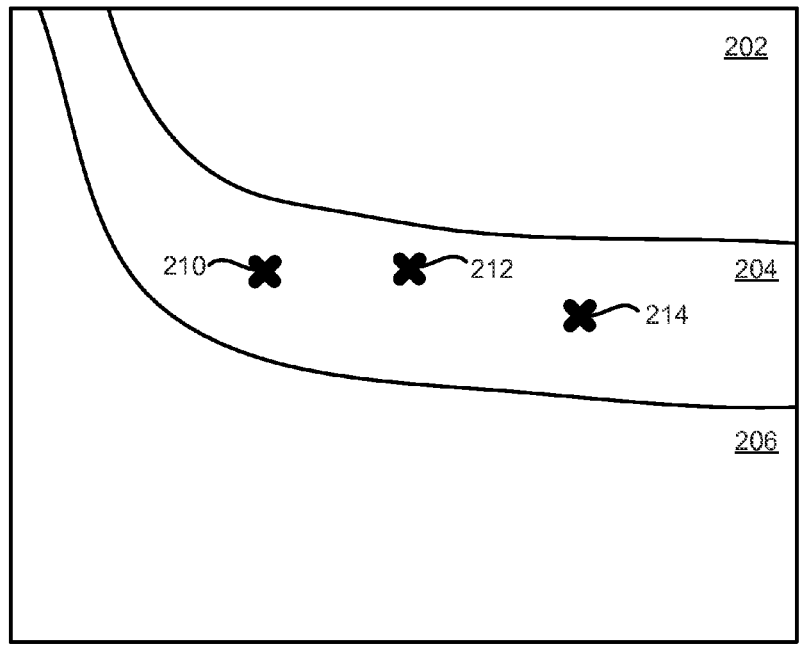
FIGS. 2-4 are graphs representing different cooling profiles for components in the information handling system.

FIG. 2 shows a graphical representation of the components 104, 106, and 108 being placed with one of the different cooling domains of the information handling system 100. The graph includes three different domains or regions: a failure domain 202; an air cooled domain 204; and a liquid cooled domain 206. If the controller 102 determines that a component is located with the failure domain 202, the controller can provide a signal to the component, via bus 134, to shut down that component. In an embodiment, the controller 102 can determine that each of the components 104, 106, and 108 are located within the air cooled domain 204, as indicated by respective points 210, 212, and 214 in FIG. 2.

Referring back to FIG. 1, in this embodiment, the controller 102 can continue normal fan control of each of the fans 118, 122, and 124, and can maintain air cooled power capping limits on the components 104, 106, and 108. The controller 102 can maintain these settings to prevent the components 104, 106, and 108 from over-heating during operation of the server 100. In another embodiment, one of the components 104, 106, or 108 can be mapped to a different cooling domain than the other two components as shown in FIG. 3.

Figure 3:
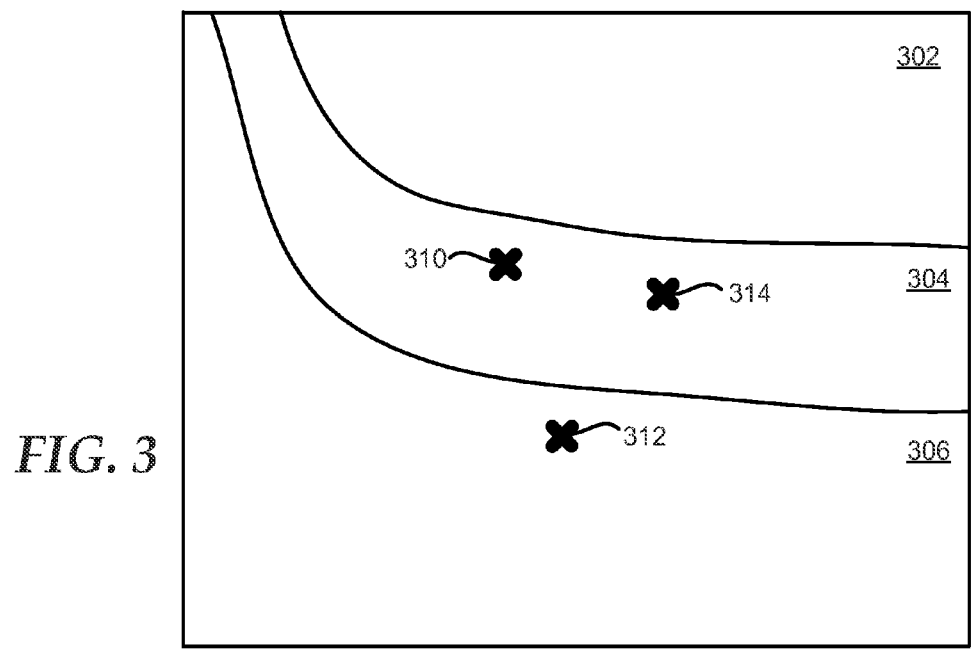

FIG. 3 shows a graphical representation of the different cooling domains: a failure domain 302; an air cooled domain 304; and a liquid cooled domain 306. In this embodiment, the controller 102 can determine, based on the thermal resistance comparison described above, that the components 104 and 108 are located within the air cooled domain 304, as indicated by respective points 310 and 314, that the component 106 is located within the liquid cooled domain 306, as indicated by point 312, and that none of the components are located within the failure domain 302. Based on the determined cooling domains of the components, the controller 102 can detect that direct-to-chip liquid cooling is being implemented for the component 106. This determination can be made in response to component 106 being the only component located within the liquid cooled domain 306 while components 104 and 108 are located within the air cooled domain 304.

Referring back to FIG. 1, the component 106 is in physical communication with liquid cooling device 120. The thermal resistance of the component 106, when cooled by the liquid cooling device 120, can be lower at a particular fan speed as compared to the thermal resistance of the component at the same fan speed but without the liquid cooling device being utilized as a cooling device for the component. In the embodiment represented in FIG. 3, the controller 106 can continue normal fan control of both of the fans 118 and 124, and can maintain air cooled power capping limits on the components 104 and 108. However, the controller 106 can disable the fan controls and fan failure warnings for fan 122, and can adjust the power capping limit for component 106. For example, the controller 102 can communicate with fan 122 and can reduce the fan speed or can completely turn off the fan, because the liquid cooling device 120 can provide the proper heat dissipation for the component.

In an embodiment, when a component is within the liquid cooled domain, the associated fan can be removed from the information handling system 100 so that additional space for other components can be made within the information handling system, to save cost within the information handling system, to reduce power, or the like. The controller 102 can also disable the fan failure warnings for fan 122 so that when the fan speed drops below a threshold fan speed, the component 106 is not either flag for possible over-heating, reduced in power, or the like. The controller 106 can also reallocate power from the fan 122 to the component 106 to increase the power capping limit for the component. In an embodiment, the power capping limits for the component can also be increase to allow the component to draw more power because of the increased cooling capability of the liquid cooling device 120 can enable the additional heat generated by the consumption of the additional power to be removed from the component 106. Thus, the controller 102 can individually change cooling control settings based on the respective cooling domain for each component. In another embodiment, all of the components 104, 106, and 108 can be mapped to the liquid cooled domain as shown in FIG. 4.

Figure 4:
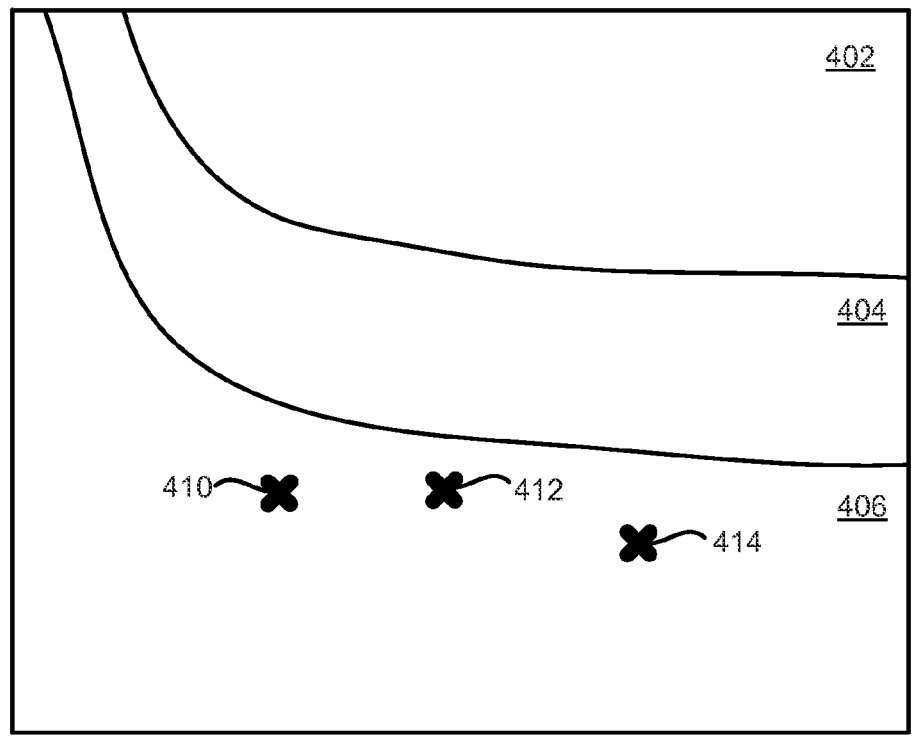

FIG. 4 shows a graphical representation of the different cooling domains: a failure domain 402; an air cooled domain 404; and a liquid cooled domain 406. In this embodiment, the controller 102 can determine, based on the thermal resistance comparison described above, that all of the components 104, 106, and 108 are located within the liquid cooled domain 406, as indicated by respective points 410, 412, and 414. The controller 102 can also determine that none of the components are located within either the failure domain 402 or the air cooled domain 404. Based on the determination that all of the components 104, 106, and 108 are within the liquid cooled domain 406, the controller 102 can detect that either the server 100 is utilizing immersion cooling, that direct-to-chip liquid cooling is being implemented for each of the components, or the like.

Referring back to FIG. 1, in this embodiment, each of the components 104, 106, and 108 can in physical communication with a liquid cooling device, such as liquid cooling device 120, which can decrease the thermal resistance of the components without having to increase fan speeds. In another embodiment, the entire server 100 can be cooled using a liquid immersion. In this embodiment, all of the components 104, 106, and 108 can be cooled by being placed in a thermally, but not electrically, conductive liquid. In different embodiments, the liquid could be a transformer oil, another specialty electrical cooling oil, a cooking oil, a motor oil, a silicone oil, or the like For either type of liquid cooling, such as immersion or direct-to-chip, the controller 102 can disable the fan controls and fan failure warnings for fans 118, 122, and 124, and can adjust the power capping limits for components 104, 106, and 108. For example, the controller 102 can disable the fan failure warnings for fans 118, 122, and 124. The controller 102 can then communicate with the fans 118, 122, and 124, and can either reduce the fan speeds or can completely turn off the fans, because the liquid cooling can provide the proper heat dissipation for the components. The controller 102 can also reallocate power from the fans 118, 122, and 124 to the components 104, 106, and 108 to increase the power capping limits for the components.

Thus, the controller 102 can determine different cooling domains for the components 104, 106, and 108 based on calculated thermal resistances of the components, and can then adjust, if needed, the cooling control settings for the components based on the determined cooling domain.

Figure 5:
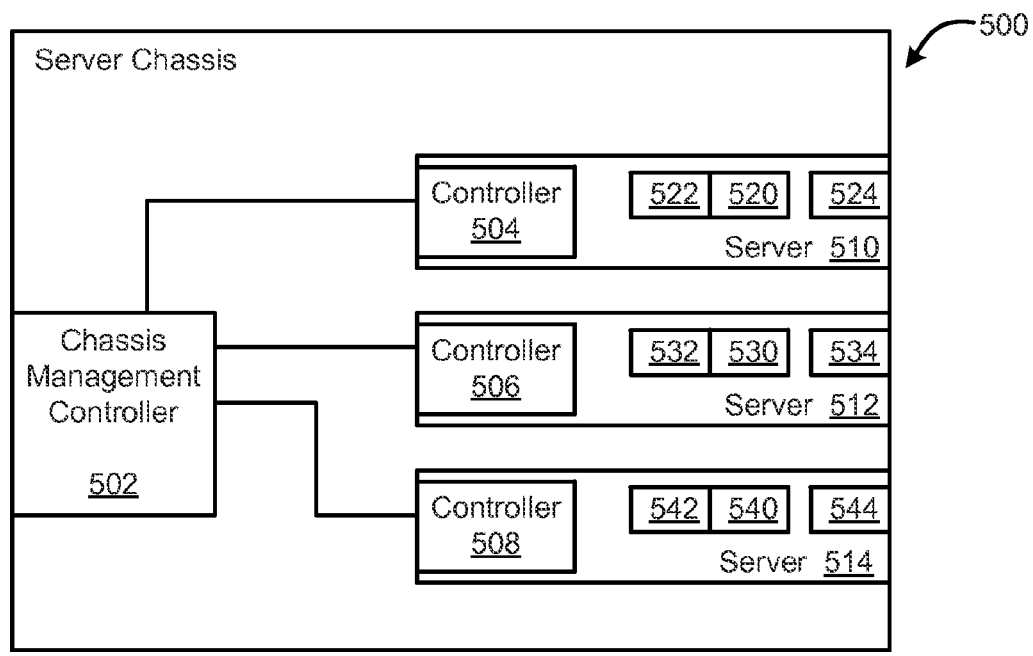
FIG. 5 is a block diagram of an alternate embodiment of the information handling system.

In the foregoing description, the disclosure has been described with reference to specific examples of an embodiment. It will, however, be evident that various modifications and changes may be made therein without departing from the broader spirit and scope of the disclosure as set forth in the appended claims. For example, in the above discussion, the information handling system 100 was described as being a single server. As such, the controller 102 implements the cooling controls for each component within the server. In an alternate embodiment however, as illustrated in FIG. 5, the information handling system 500 can be a server chassis. In such a configuration, the server chassis 500 would include a chassis management controller 502 that is in communication with controllers 504, 506, and 508 within respective servers 510, 512, and 514 to receive thermal resistances for components within each of the servers.

For example, the controller 504 can determine the thermal resistance of component 520 based on a temperature value for the component received from temperature sensor 522 and the ambient temperature of the server 510. The controller 504 can then provide the thermal resistance of component 520 to the chassis management controller 502. Similarly, the controller 506 can determine the thermal resistance of component 530 based on a temperature value for the component received from temperature sensor 532 and the ambient temperature of the server 512, and can then provide the thermal resistance of component 530 to the chassis management controller 502. The controller 508 can determine the thermal resistance of component 540 based on a temperature value for the component received from temperature sensor 542 and the ambient temperature of the server 514, and then provide the thermal resistance of component 540 to the chassis management controller 502.

The chassis management controller 502 can receive the thermal resistances from each of the controllers 504, 506, and 508, and can adjust the cooling control settings either on a server-by-server basis or on a server chassis level. For example, if a portion of the controllers 504, 506, or 508 provide thermal resistances indicating a liquid cooling domain, the chassis management controller 502 can disable the fan controls of a portion of fans 524, 534, and 544, disable fan failure warnings the specific servers within the liquid cooling domain, and adjust the power capping limits for these servers in a substantially similarly manner as described above for the controller 102 within information handling system 100.

Figure 6:
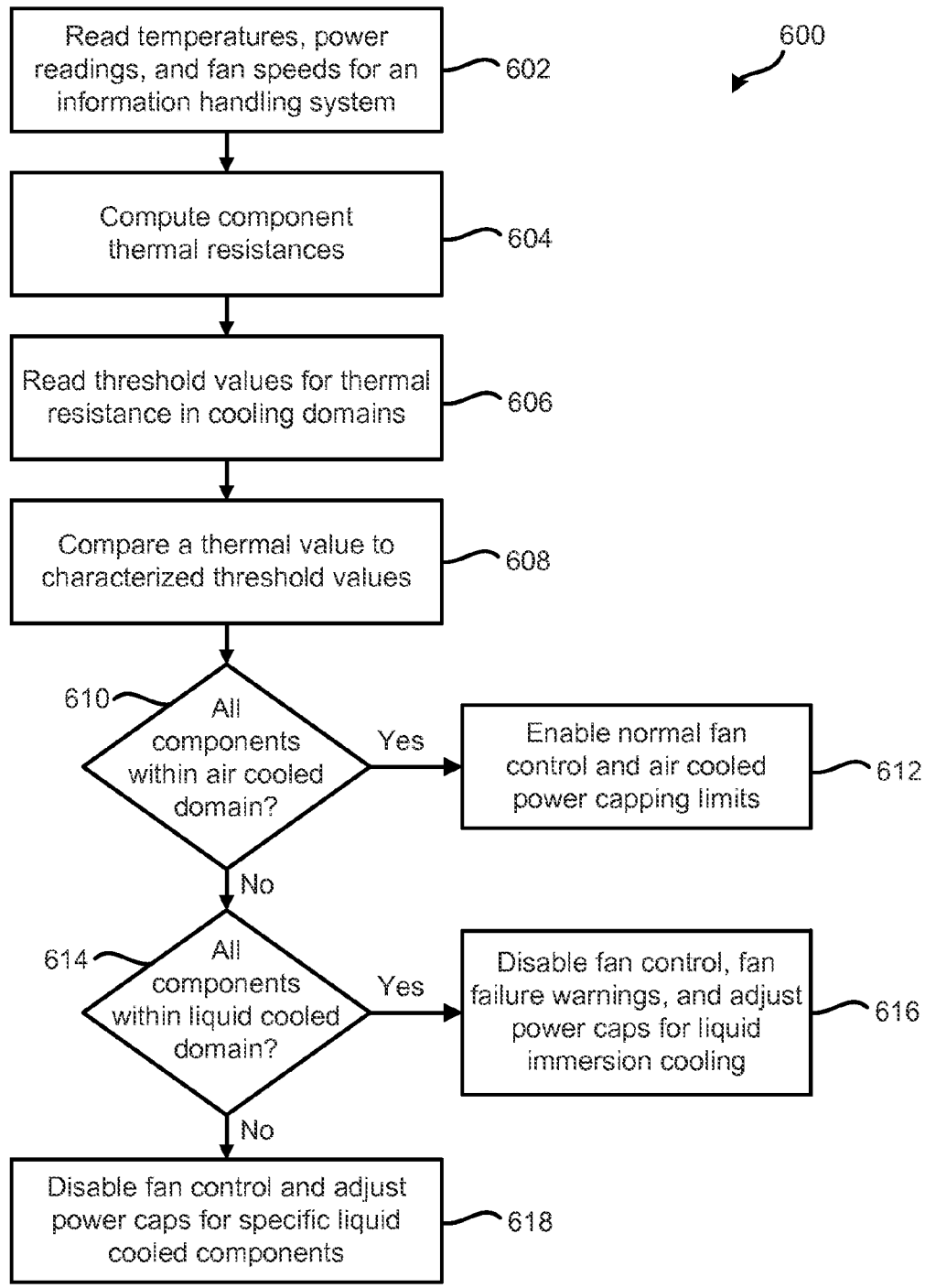
FIG. 6 is a flow diagram of a method for detecting the presence of alternate cooling systems.

FIG. 6 shows a flow diagram of a method 600 for determining cooling domain for each of a plurality of components within an information handling system. At block 602, temperatures, power readings, and fan speeds are read at different locations of the information handling system. In an embodiment, the information handling system can include multiple components and a temperature, power reading, and fan speed is read individual for each component within the information handling system. A thermal resistance is computed for each component at block 604. In an embodiment, the thermal resistance is based on the temperature of a component minus an ambient temperature of the server, and the resulting temperature value is then divided by a power reading of the component. At block 606, threshold values for thermal resistances versus amounts of air flow for different cooling domains are read. In an embodiment, the threshold values are read from a firmware table.

At block 608, the thermal resistance values for the components are compared to the threshold values to determine a cooling domain for each of the components. The flow then continues at block 610, and a determination is made whether all of the components are within an air cooled domain. If all of the components are within the air cooled domain, the flow proceeds to block 612 and normal fan control and air cooled power capping limits of the components are enabled. Otherwise, the flow proceeds to block 614 and a determination is made whether all of the components are within a liquid cooled domain. If all of the component are within the liquid cooled domain, fan controls and fan failure warnings are disabled for the components, and power capping limits for the components are adjusted for liquid immersion or direct-to-chip liquid cooling at block 616. However, if all of the components are not within the liquid cooled domain, fan controls and fan failure warnings are disabled only for the specific components mapped within the liquid cooling domain, and power capping limits for these components are also adjusted at block 618.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system. This program can be stored within a memory, or computer-readable medium, that can be read by a processor of the computer system or information handling system.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a plurality of components; and
a controller to communicate with each of the components, wherein the controller calculates a separate thermal resistance for each of the components, categorizes each component into one of a plurality of cooling domains based on the thermal resistance of the component and an amount of air flow around the component, wherein the cooling domains include an air cooled domain and a liquid cooled domain, and adjusts cooling controls for each of the components based on the respective cooling domain of the component, and reallocates power from a fan for a component to the component in response to the component being in a liquid cooled domain.

2. The information handling system of claim 1, further comprising:
a temperature sensor associated with a first one of the components, the temperature sensor to provide a temperature value of the first component to the controller, wherein the controller determines a first thermal resistance of the first component based on the temperature value received from the temperature sensor.

3. The information handling system of claim 1, further comprising:
a fan associated with the first component, the controller to determine that the first component is in the liquid cooling domain, and to disable a fan speed control of the fan in response to the first component being in the liquid cooling domain.

4. The information handling system of claim 1, the controller to determine that each of the components is within the air cooled domain, and to implement an air cooled cooling control settings for the information handling system in response to each of the components being within the air cooled domain.

5. The information handling system of claim 1, the controller to determine that a first portion of components are within a liquid cooled domain, to disable fan controls and fan failure warnings for the first portion of the components in response to the first portion of components being within the liquid cooled domain, and to adjust power capping limits for the first portion components in response to the first portion of components being within the liquid cooled domain.

6. The information handling system of claim 5, wherein the first portion of components includes all of the components in response to the all of the components being within a liquid cooled domain.

7. The information handling system of claim 5, wherein the first portion of components includes a subset of the components in response to only the first portion of components being within a liquid cooled domain.

8. A method comprising:
calculating a respective thermal resistance value of each of a plurality of components;
receiving air flow of each fan associated with each of the components;
determining, by a processor, a cooling domain for each of the components based on the respective thermal resistance value of each of the components, wherein the cooling domain is selected from an air cooled domain and a liquid cooled domain;
comparing the calculated respective thermal resistance value verses the associated air flow for each of the components with stored threshold thermal resistance values versus air flow for the air cooled domain;
determining whether all of the components are within the air cooled domain based on the comparison of the calculated respective thermal resistance value verses the associated air flow for each of the components with the stored threshold thermal resistance values versus air flow for the air cooled domain; and
if all of the components are within the air cooled domain, enabling, by the processor, normal fan control and air cooled power capping limits for the components, otherwise disabling fan controls and fan failure warnings for a first portion of the components, adjusting power capping limits for the first portion components, and reallocating power from fans for the first portion of components to the first portion of components.

9. The method of claim 8, wherein the first portion of components includes all of the components in response to the all of the components being within the liquid cooled domain.

10. The method of claim 9, wherein all of the components are cooled via liquid immersion when all of the components are in the liquid cooled domain.

11. The method of claim 9, wherein all of the components are cooled via direct-to-chip liquid cooling when all of the components are in the liquid cooled domain.

12. The method of claim 8, wherein the first portion of components includes a subset of the components in response to only the first portion of components being within a liquid cooled domain.

13. The method of claim 8, further comprising:
reading a temperature, a power reading, and a fan speed for each individual component within the information handling system.

14. The method of claim 8, wherein the thermal resistance is based on the temperature of a component.

15. The method of claim 8, wherein threshold values for the thermal resistance of the components are read from a firmware table, and the threshold values are utilized in the determining of the cooling domains.

16. A non-transitory computer-readable medium comprising a set of instructions, the set of instructions when executed by a processor cause the processor to:

determine a cooling domain for a first component of an information handling system based on a first thermal resistance value for the first component;

determine whether the first component is within an air cooled domain; and if the first component is within the air cooled domain, enable normal fan control and air cooled power capping limit for the first component, otherwise disable the fan controls and the fan failure warnings for the first component, adjust the power capping limit for the first component, and reallocate power from a fan for the first component to the first component.

17. The non-transitory computer-readable medium of claim 16, wherein the instruction further cause the processor to:

determine a cooling domain for a second component of the information handling system based a second thermal resistance value of the second component;

determine whether the second component is within the air cooled domain; and if the second component is within the air cooled domain, enable normal fan control and air cooled power capping limit for the second component, otherwise disable the fan controls and the fan failure warnings for the second component and adjust the power capping limit for the second component.

18. The non-transitory computer-readable medium of claim 16, wherein the instruction further cause the processor to:

reading threshold values for thermal resistances versus fan speed for different cooling domains of the information handling system, wherein the threshold values are utilized in the determining of the cooling domain of the first component.

19. The non-transitory computer-readable medium of claim 18, wherein the threshold values are read from a firmware table.

20. The non-transitory computer-readable medium of claim 16, wherein the instruction further cause the processor to:

determine that the first component is in a liquid cooled domain prior to disabling the fan controls and the fan failure warnings for the first component and adjusting the power capping limit for the first component.

\* \* \* \* \*